United States Patent
Scannell

(10) Patent No.: US 9,674,939 B2
(45) Date of Patent: Jun. 6, 2017

(54) METHOD FOR PRODUCING A MECHANICALLY AUTONOMOUS MICROELECTRONIC DEVICE

(71) Applicant: COMMISSARIAT A L'ENERGIE ATOMIQUE ET AUX ENE ALT, Paris (FR)

(72) Inventor: Mark Scannell, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/310,604

(22) Filed: Jun. 20, 2014

(65) Prior Publication Data
US 2015/0156862 A1    Jun. 4, 2015

(30) Foreign Application Priority Data

Jun. 20, 2013 (FR) .................................... 13 55833

(51) Int. Cl.
*H05K 1/11* (2006.01)
*H05K 1/02* (2006.01)
(Continued)

(52) U.S. Cl.
CPC ......... *H05K 1/0206* (2013.01); *H01L 21/486* (2013.01); *H01L 23/49827* (2013.01);
(Continued)

(58) Field of Classification Search
CPC .. H05K 1/00; H05K 1/02; H05K 1/03; H05K 1/11; H05K 1/16; H05K 1/18; H05K 3/00;
(Continued)

(56) References Cited

U.S. PATENT DOCUMENTS

| 5,604,018 A | * | 2/1997 | Horiuchi | ................. | B32B 37/18 |
| | | | | | 156/60 |
| 5,637,834 A | * | 6/1997 | La Bate, Jr. | ......... | H05K 3/4617 |
| | | | | | 174/262 |

(Continued)

FOREIGN PATENT DOCUMENTS

| EP | 1 156 525 A1 | 11/2001 |
| EP | 2 469 589 A1 | 6/2012 |
| FR | 2 901 636 A1 | 11/2007 |

OTHER PUBLICATIONS

French Preliminary Search Report issued Jan. 23, 2014 in FR Application 13 55833, filed on Jun. 20, 2013 ( with English Translation of categories of Cited Documents).

(Continued)

*Primary Examiner* — Xiaoliang Chen
(74) *Attorney, Agent, or Firm* — Oblon, McClelland, Maier & Neustadt, L.L.P.

(57) ABSTRACT

The invention relates to a method for producing a mechanically autonomous microelectronic device comprising at least one electric via enabling an electric connection from at least one first face of the device, characterized in that it comprises the following sequence of operations:
  from a first substrate comprising a first portion of the electric via exposed to a first face of the first substrate, and from a second substrate comprising a second portion of the electric via exposed to a first face of the second substrate, a step of bonding of the first substrate onto the second substrate, by bonding the first faces thereof so that the first portion and the second portion of the electric via are in electrical continuity,
  step of partially removing a part of the first substrate from a second face of the first substrate, opposite the first face of said first substrate, so as to reach the first portion of the electric via.

16 Claims, 4 Drawing Sheets

(51) Int. Cl.
 H01L 23/498 (2006.01)
 H01L 21/48 (2006.01)
 H05K 3/36 (2006.01)
 H05K 1/14 (2006.01)
(52) U.S. Cl.
 CPC ..... *H01L 23/49833* (2013.01); *H05K 1/0298* (2013.01); *H05K 3/36* (2013.01); *H01L 2924/0002* (2013.01); *H05K 1/115* (2013.01); *H05K 1/141* (2013.01); *H05K 2201/10378* (2013.01); *Y10T 29/49126* (2015.01)
(58) Field of Classification Search
 CPC .. H05K 3/10; H05K 3/20; H05K 3/36; H05K 3/40; H05K 3/42; H05K 3/46; H01L 21/00; H01L 21/02; H01L 21/20; H01L 21/48; H01L 21/50; H01L 23/48; H01R 12/04; H01R 12/51; B32B 3/10; B32B 37/14; B32B 37/18
 USPC ............... 174/262, 254–258, 260, 264, 266; 29/829–831, 846, 852; 438/69, 107, 618, 438/623, 631, 645; 428/138, 210; 361/767
 See application file for complete search history.

(56) References Cited

U.S. PATENT DOCUMENTS

| | | | |
|---|---|---|---|
| 5,734,560 A | 3/1998 | Kamperman et al. | |
| 5,773,195 A | 6/1998 | Kamperman et al. | |
| 6,098,280 A | 8/2000 | Kamperman et al. | |
| 6,171,946 B1* | 1/2001 | Tsukamoto | H01L 21/4857 438/623 |
| 6,261,941 B1* | 7/2001 | Li | H05K 3/4647 438/618 |
| 6,534,723 B1 | 3/2003 | Asai et al. | |
| 6,594,891 B1 | 7/2003 | Kamperman et al. | |
| 7,196,274 B2* | 3/2007 | Cooper | H01P 3/088 174/255 |
| 7,202,419 B2* | 4/2007 | Cooper | B32B 37/0015 174/255 |
| 7,858,429 B2* | 12/2010 | Akram | H01L 21/76898 438/193 |
| 8,978,244 B2* | 3/2015 | Cai | H05K 3/20 174/262 |
| 2001/0023779 A1* | 9/2001 | Sugaya | H05K 1/16 174/255 |
| 2002/0166697 A1* | 11/2002 | Janecek | H05K 3/462 174/262 |
| 2003/0085058 A1* | 5/2003 | Komatsu | H05K 3/4069 174/264 |
| 2004/0065960 A1* | 4/2004 | Egitto | H01L 21/486 257/774 |
| 2004/0264103 A1* | 12/2004 | Otsuka | H01G 2/065 361/306.1 |
| 2005/0025942 A1* | 2/2005 | Kloster | H01L 21/76251 428/209 |
| 2006/0001166 A1* | 1/2006 | Igarashi | H01L 23/3128 257/758 |
| 2006/0154434 A1* | 7/2006 | Das | H05K 1/162 438/393 |
| 2007/0124924 A1* | 6/2007 | Nakamura | H05K 3/0097 29/830 |
| 2007/0124925 A1* | 6/2007 | Nakamura | H01L 21/6835 29/830 |
| 2008/0138576 A1* | 6/2008 | Nozu | B32B 18/00 428/138 |
| 2008/0196934 A1* | 8/2008 | Chen | H05K 3/205 174/262 |
| 2008/0271915 A1* | 11/2008 | Wang | H05K 1/0219 174/266 |
| 2008/0284037 A1 | 11/2008 | Andry et al. | |
| 2009/0056119 A1* | 3/2009 | Okabe | H05K 3/205 29/846 |
| 2009/0139760 A1* | 6/2009 | Tanaka | H05K 1/162 174/264 |
| 2009/0311828 A1 | 12/2009 | Andry et al. | |
| 2010/0013073 A1 | 1/2010 | Andry et al. | |
| 2011/0079349 A1* | 4/2011 | Cho | H05K 3/4682 156/247 |
| 2011/0154657 A1* | 6/2011 | Chuang | H05K 3/0097 29/829 |
| 2011/0165730 A1* | 7/2011 | Ohba | B81C 1/00238 438/107 |
| 2011/0193199 A1* | 8/2011 | Filippi | H01L 21/76898 257/621 |
| 2011/0302775 A1* | 12/2011 | Cai | H05K 3/4697 29/829 |
| 2011/0303454 A1* | 12/2011 | Yoshimura | H05K 3/4069 174/264 |
| 2012/0003844 A1* | 1/2012 | Kumar | H05K 3/4614 439/55 |
| 2012/0161333 A1 | 6/2012 | Thuaire et al. | |
| 2012/0181648 A1 | 7/2012 | Andry et al. | |
| 2012/0217498 A1* | 8/2012 | Yamanaka | H01L 27/1461 257/48 |
| 2012/0227261 A1* | 9/2012 | Inui | H05K 1/186 29/849 |
| 2013/0043067 A1* | 2/2013 | Hayashi | B32B 5/022 174/258 |
| 2013/0063918 A1 | 3/2013 | Haba et al. | |
| 2013/0111746 A1* | 5/2013 | Maeda | H05K 3/0097 29/846 |
| 2013/0213695 A1* | 8/2013 | Lee | H05K 1/0278 174/254 |
| 2013/0215586 A1* | 8/2013 | Furusawa | H05K 1/0206 361/767 |

OTHER PUBLICATIONS

Dr. Handel H. Jones "Technical Viability of Stacked Silicon Interconnect Technology", IBS research, 2010, 10 pages.
Xilinx Inc. "Xilinx ships world's first heterogeneous 3D FPGA using 2.5D silicon interposer", http://www.i-micronews.com/news/Xilinx-worlds-heterogeneous-3D-FPGusing-2-5D-silicon-interp,8943.html, 2 pages.
N. Rouger et al. "True 3D Packaging Solution for Stacked Vertical Power Devices", Full Paper, V6, 4 pages.
L. Di Cioccio et al. "200° C. direct bonding copper interconnects : electrical results and reliability", 4 pages.
N. Sillon et al. "TSV and Cu—Cu direct bonding: two key technologies for High Density 3D", SSDM 2011, 63 pages.

* cited by examiner

METHOD FOR PRODUCING A MECHANICALLY AUTONOMOUS MICROELECTRONIC DEVICE

FIELD OF THE INVENTION

The present invention relates to 3D (three-dimension) integration, and more particularly 2.5D integration, also known as interposers technology. The invention more particularly relates to the production of a mechanically autonomous microelectronic device comprising at least one electric via.

TECHNOLOGICAL BACKGROUND

Referring to the Moore law which empirically foresees the doubling of integration of the components in the electronic industry every two years, the current developments of electronics are often mentioned as following two complementary directions. One development consists of « More Moore» miniaturisation, i.e. continually reducing the dimensions of the elementary components. Simultaneously, the « More than Moore» diversification defines the trend consisting in integrating more and more different functionalities in the same chip, whatever the degree of miniaturisation. Both developments are simultaneous and concern a wide range of technologies and methods which are studied by all the major research and development services. Among the methods studied a three-dimension « 3D integration» architecture consists in vertically stacking electronic components, by superimposing chips and/or wafers and by establishing short electric connections between such components, directly through the layers. 3D integration requires to control the electric connections between the various vertically stacked chips. It must face many challenges, and more particularly the complex design, the problems entailed in thermal dissipation, the absence of standardisation, reliability, the definition of test strategies adapted to stacked circuits.

The two types of connectics generally used to bring the signals to the inputs and outputs of a circuit are the "wire bonding" and the bonding of "flip chips". Several approaches are available for connecting several chips in the same «packaging», without choosing the solution of external wiring. Among all such integration approaches, the common vector lies in the utilisation of through electric vias to bond the electric connections from a first face to a second face without using a wire external to the chip. Two options are provided for executing the intra-chip connections. The first option consists in implementing the through electric vias directly into one of the active chips of the stack. The second one which is more commonly used, consists in designing a mechanically autonomous microelectronic device or passive substrate, also called an interposer, which connects two "sandwich" implemented chips around the device. Both systems communicate, through the latter, using an internal routing and through electric vias which connect the front face and the rear face of the interposer. When several components are positioned side by side on the same mechanically autonomous microelectronic device, this is called 2.5D integration.

Silicon interposers have recently been developed in the industry. However, a certain number of drawbacks makes the use thereof difficult. As a matter of fact, the current interposers are not mechanically stable because of their low thickness. Generally speaking, they are rather thin since they are provided with vertical electric connections (of the TSV type, i.e. the acronym for « Through Silicon Via» or the acronym TGV for « Through Glass Via»), to enable the passage of the electric signal from an upper face («chip interconnects») to a lower face («substrate interconnects»).

In the case of silicon, the current advanced manufacturing technology makes it possible to form through electric vias having a form factor of about 10:1. Considering the electric requirements and the cost of filling the copper-made through electric vias, many industrialists have selected a practical diameter for the through electric vias, of the order of 10 microns. A form factor of 10 to 1, means that the length of the through electric vias and, consequently the thickness of the interposers are generally limited to 80 to 120 microns. Over the next few years, larger form factors will have to be aimed at for the through electric vias; a form factor of, for instance, 20 to 1 is even a goal for some industrialists. Even with an improved form factor, the length of the electric vias however requires the production and the utilisation of a very thin interposer, consequently having an inherent mechanical brittleness.

As silicon interposers have a major drawback in that they are relatively thin and thus mechanically fragile, electric measurements and tests are more and more difficult and may become soon almost impossible. Interposers will probably be tested prior to assembling, and the cost of non-compliance will thus be very high. Few companies are still capable of manufacturing both chips and interposers today. When only one manufacturer is involved in the production of chips and interposers, the issues of recovering non-compliance costs can be dealt with internally and can be more easily controlled. But as they do not know how to perform testing and quantifying, it is very difficult for two distinct manufacturing companies to agree on non-compliance terms and conditions. This means that a company producing chips and another company producing substrates will non longer cooperate, which will unavoidably affect the production lines of the companies not having a manufacturing unit, as well as the development costs.

The manufacturing process of a silicon interposer is currently difficult (and thus costly). One of the main reasons (in addition to high costs) is that the current method requires the handling and processing of very thin wafers. Advanced technologies are used when handling wafers, when the very thin silicon interposer remains attached to the silicon or glass substrate using temporary bonding. Bonding, and unbonding, which are followed by the handling of very thin components, thus become very difficult. Many alternative bonding and unbonding techniques exist, for instance the so-called « laser release», « temperature release», « multilayer glue», « spin-on», « laminate» techniques. Generally speaking, the industry however was unable to agree on a reference technique; each technique has drawbacks.

Whatever the integration method selected for manufacturing silicon interposers, the final device is very thin. As the interposer is exposed to different stresses on each one of its faces (the upper face and the lower face have a very different structures and apparently require different interconnections locations), the silicon interposer tends to bend and then to deform. The larger the surface of the interposer, the worst the bending and deformation thereof.

This is the main technical challenge when designing interposers today, before cost.

The present invention makes it possible to remedy all or at least some of the drawbacks of the current techniques. The invention provides for producing a mechanically stable and autonomous microelectronic device complying with the needs of the production line.

SUMMARY OF THE INVENTION

One aspect of the invention relates to a method for producing a mechanically autonomous microelectronic device comprising at least one electric via enabling an electrical connexion from at least a first face of the device.

According to the invention, the method of production comprises the following sequence of steps:
- from a first substrate comprising a first portion of the electric via exposed to a first face of the first substrate, and from a second substrate comprising a second portion of the electric via exposed to a first face of the second substrate, a step of bonding the first substrate onto the second substrate, by bonding the first faces thereof so that the first portion and the second portion of the electric via are in electrical continuity,
- step of partially removing a part of the first substrate from a second face of the first substrate, opposite the first face of said first substrate, so as to reach the first portion of the electric via.

According to the invention, microelectronic device means a device comprising elements having micronic and/or nanometric dimensions, with the mechanically autonomous device comprising such elements having dimensions in centimeters, or even less.

The invention also relates to a mechanically autonomous microelectronic device comprising at least one electric via enabling an electric connection from at least one first face of the device, characterized in that a first substrate comprising a first portion of an electric via exposed to a first face of the first substrate and a second substrate comprising a second portion of an electric via exposed to a first face of the second substrate, cooperate from a bonding interface.

A technical effect produced by the present invention consists in forming a solid electric via having a higher form factor, from portions of the electric via of different substrates.

Besides, the present invention enables to make mechanical a microelectronic device comprising at least one electric via stable and autonomous. The method according to the present invention more particularly enables to reduce the brittleness, deformation and bending of the interposers.

BRIEF DESCRIPTION OF THE FIGURES

The aims and objectives as well as the characteristics and advantages of the invention will emerge better from the detailed description of an embodiment of the latter, illustrated by the following accompanying drawings wherein.

The drawings appended herein are given as examples and are not limiting to the invention. These are schematic drawings intended to facilitate the understanding of the invention and are not necessarily at the scale of practical applications. More particularly, the relative thickness of the various layers and substrates are not a representation of reality.

DETAILED DESCRIPTION

Before making a detailed review of the embodiments of the invention, optional characteristics which may be used in any combination or as alternative solutions are listed hereafter:
- The method comprises a step of assembling, including a direct bonding.
- The method comprises step of partially removing a part of the second substrate from a second face of the second substrate, opposite the first face of said second substrate, so as to reach the second portion of the electric via.
- The method comprises the production of at least another electric via simultaneously with said at least one electric via, with the vias comprising a material with thermal and electric properties so that said other electric via forms a thermal via.
- The method comprises a step of assembling at least another substrate on the first substrate and/or the second substrate.
- The method comprises a step of assembling comprising a step of aligning the first portion of the electric via of the first substrate with the second portion of the electric via of the second substrate.
- The method comprises a step of assembling followed by a step of annealing.
- The method comprises a step of partially removing a part of the first substrate comprising polishing.
- The device comprises a direct bonding interface.
- The device is so configured as to produce an interposer.
- The device comprises at least one electric via so arranged as to produce a capacity electrode.
- The devices comprises a section of the first portion of the electric via of the first substrate which is equal to the section of the second portion of the electric via of the second substrate.
- The devices comprises a section of the first portion of the electric via of the first substrate which is greater than the section of the second portion of the electric via of the second substrate.
- The device comprises at least another electric via simultaneously with said at least one electric via with the vias being made of a material having thermal and electric properties so that said other electric via forms a thermal via.

The device comprises each portion of the via, the height of which is smaller than 200 microns and generally smaller than 150 microns.

The device comprises a diameter of the electric via, the height of which is smaller than 20 microns and generally smaller than 15 microns.

The device comprises the at least one electric via made of a metallic material.

The device comprises at least one substrate totally or partially made of a silicon- or glass-based material.

Figure 1A:
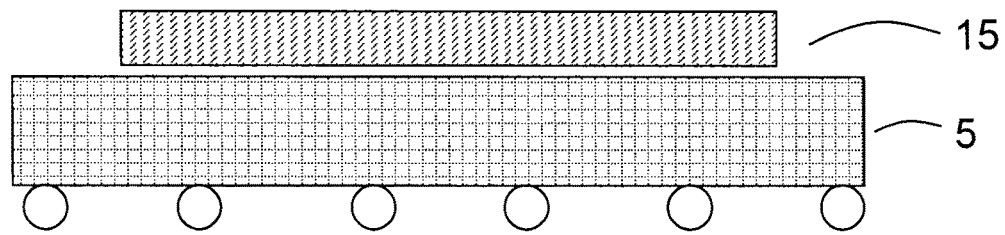
FIG. 1A illustrates a microelectronic device comprising a substrate and a chip according to a known method of the prior art.

FIG. 1A illustrates a microelectronic device comprising a substrate 5 and a chip 15. Using a flip chip 15 preferably made of silicon positioned on an organic substrate 5 (such substrate may also be made of ceramics) is known in the prior art, with the assembly being encapsulated in a protective "packaging", for instance made of polymer. The silicon chip 15 and the substrate 5 are electrically connected using various types of developing technologies.

With Moore's law and the reduction in the chips 15 number, such chips are always smaller whereas the number of interconnections on each chip 15 is constantly increasing. The width of the interconnections on the current chips 15 thus becomes smaller and smaller. However, it is still difficult to proportionally reduce the width of the interconnections on the substrates 5, more particularly the organic ones. The organic/ceramic substrate 5 is close to reach, or even has already reached its limits as regards the width of the interconnections. Consequently, a gap exists in the dimensional scales between the requirements as regards the small width of the interconnections required on the current silicon chips 15 and the limitation on the substrates 5 requiring a wide gap of the interconnections.

Figure 1B:
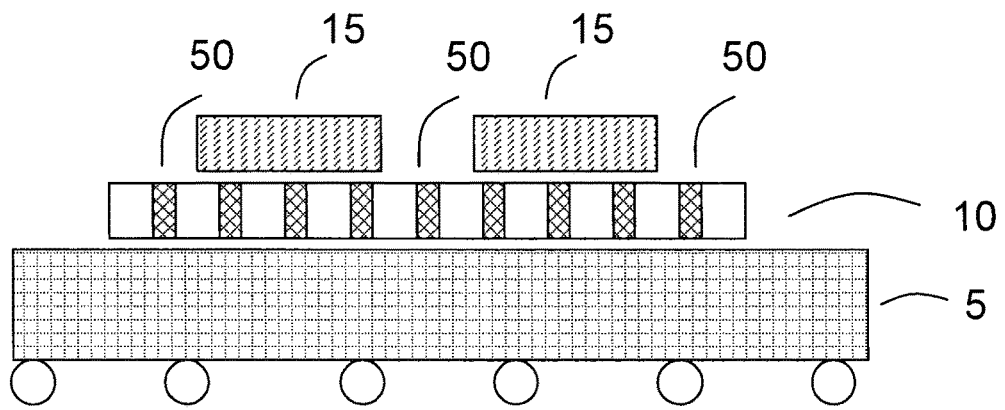
FIG. 1B illustrates an interposer, inserted between at least one chip and one substrate, providing an output wiring between a small gap (from the chip) and a large gap (from the substrate).

One of the solutions to this problem developed in the industry consisted in developing an interposer 15, preferably made of silicon. FIG. 1B illustrates an interposer 10, inserted between at least one silicon chip 15 and one organic substrate 5, providing an output wiring between a small gap (from the chip 15) and a large gap (from the substrate 5). The electric signal must flow from a first face of the interposer 10 up to a second face of the interposer 10, opposite the first face, through at least one electric via 50 made of silicon, of the TSV type. As mentioned above, the technology of through electric vias of the TSV type limits the thickness of the interposer 10 to approximately 200 microns. During the standard process of manufacturing the interposer 10, a first face of the interposer 10 has to be assembled to a temporary support before the substrate of the interposer 10 is thinned so as to reach a thickness of approximately 200 to 100 microns, thus exposing at least one electric via 50 from the second face of the substrate of said interposer 10. The current interposer 10 is thus not very mechanically-stable, because of its low thickness.

The following method aims at providing a mechanically autonomous microelectronic device, while referring to FIGS. 2 to 7. Mechanically autonomous devices means a self-supporting device which may be used independently of another device and which is mechanically self-working.

Figure 2:
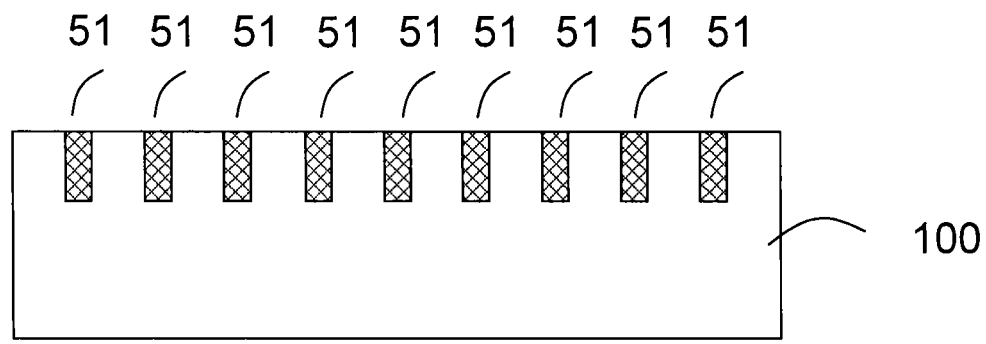
FIG. 2 illustrates a first substrate comprising at least one electric via.

FIG. 2 illustrates a first substrate 100 comprising at least a first portion 51 of at least one electric via 50. The first substrate 100 is preferably made of a non conducting or little conductive material. Today, most of the mechanically autonomous microelectronic devices of the interposer type 10 are preferably produced from a silicon-based (for instance polycrystalline silicon) substrate 100. However, a substrate 100 totally or partly made of polycrystalline silicon or a substrate 100 made of glass can also be used. The substrate 100 is particularly advantageously provided as a plate (currently called a "wafer"), but may also be a panel. Particularly advantageously, the thickness of the first substrate 100 ranges from 100 microns to 1 millimeter.

The present invention preferably relates to an embodiment essentially based on the utilization of at least one electric via 50 through a first silicon substrate 100, also known as a « Through Silicon Via » or by the acronym TSV. According to another embodiment, the invention may be applied to an electric via 50 provided through a first substrate 100 made of glass, also known as a « Through Glass Via » or by the acronym TGV. At least one electric via 50 is advantageously formed on the first substrate 100.

An electric via is a component oriented according to the thickness of a substrate, or more generally an electronic device, which provides electric continuity between two different levels, in the thickness of the substrate or of the device. Such levels may be the faces of the substrate.

It must be possible to electrically insulate the electric via 50 from the substrate it goes through, more specifically when the latter is conducting. A very good electric insulation must be provided so as to avoid any current leakage between the conductor composing the electric via 50 and the substrate. According to one embodiment, an insulating dielectric layer is thus formed in the hole previously created in the substrate to make the electric via 50. The deposition of a continuous conducting bottom follows, which is intended for, on the one hand, enabling an electrolytic filling of the electric via 50 and, on the other hand, preventing, in the course of such operation, any diffusion to the substrate of the conducting material which composes the electric via 50 by creating a diffusion barrier.

The electric via 50 is conducting. Particularly advantageously, the electric via 50 comprises copper or tungsten. However, the electric via 50 may be made of any metal. Considering the electric requirements and the cost of filling an electric via 50 made of copper, the height of the first portion 51 of the electric via 50 formed in the first substrate 100 is smaller than 200 microns (for example 100 microns). The first portion 51 of the electric via 50 advantageously has a diameter between 5 microns and 20 microns, and preferably a practical diameter of about 10 microns.

According to a preferred embodiment, the first portion 51 of the electric via 50 is cylindrical. According to another embodiment, the first portion 51 of the electric via 50 has an annular shape.

Particularly advantageously, the first portions 51 of the electric vias 50 of a first face of the first substrate 100 all have the same section, the same diameter, the same height and the same shape. According to a preferred embodiment, the first portions 51 of the electric vias 50 of the first substrate 100 are separated by the same gap. The gap between each first portion 51 of the electric vias 50 ranges, for instance, between 10 manometers and 10 microns.

Figure 3:
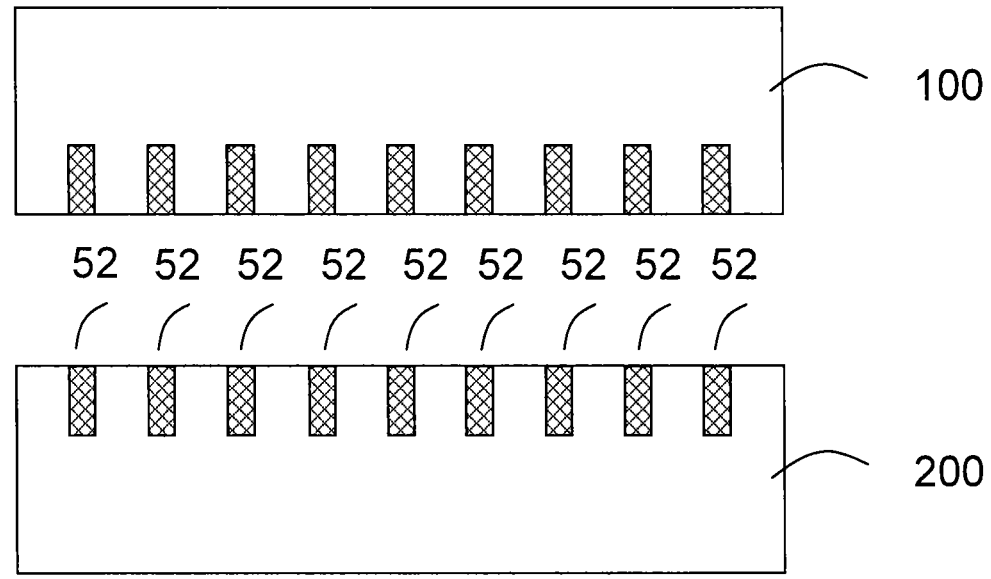
FIG. 3 illustrates the step of bonding the first substrate onto at least one second substrate.

FIG. 3 illustrates the step of assembling the first substrate with at least one second substrate 200. The second substrate 200 is preferably made of a non conducting or little conductive material. The second substrate 200 is preferably made of a silicon-based (for instance polycrystalline silicon) material, of polysilicon or of glass. Advantageously, the second substrate 200 is wafer- or panel-shaped. Particularly advantageously, the thickness of the second substrate 200 ranges from 100 microns to 1 millimeter.

The second substrate 200 comprises a second portion 52 of at least one electric via 50. The height of the second portion 52 of the electric via 50 formed in the second substrate 200 is preferably smaller than 200 microns (for example 100 microns). The second portion 52 of the electric via 50 has a diameter between 5 microns and 20 microns, and preferably a practical diameter of about 10 microns.

Particularly advantageously, the sections of each second portion 52 of the electric via 50 of the second substrate 200 are identical. The gap between each second portion 52 of the electric via 50 of the second substrate 200 is preferably identical. According to a preferred embodiment, the section of each second portion 52 of the electric via 50 of the second substrate 200 is equal to the sections of each first portion 51 of the electric via 50 of the first substrate 100. According to a preferred embodiment, the gap between each second portion 52 of the electric via 50 of the second substrate 200 is identical to the gap between each first portion 51 of the electric via 50 of the first substrate 100.

Generally speaking, it is advantageous for the first 51 and second 52 portions of the electric via 50 to be positioned in matching locations when the first faces of the substrates 100, 200 are assembled, as described hereinunder.

The step of assembling preferably comprises the step of aligning the first portion 51 of the electric via 50 of the first substrate 100 with the second portion 52 of the electric via 50 of the second substrate 200.

The precision of the offset, during the step of aligning the first portion 51 of the electric via 50 of the first substrate 100 with the second portion 52 of the electric via 50 of the second substrate 200, is, for example, smaller than one micron. The diameter of each portion 51, 52 of the electric via 50 of the first substrate 100 and of the second substrate 200 is so configured as to compensate the offset in the alignment of the first portion 51 and of the second portion 52 of the electric via 50, respectively, of the first substrate 100 and of the second substrate 200. A greater tolerance as regards the possible offset in the alignment particularly advantageously enables to increase the production rate (On the contrary, a great accuracy in the alignment imposes a slowing down in the process). On an interposer, the diameter of the interconnections is generally smaller on the upper face than on the lower face, which means that forming an electric via 50, the diameter of the first face of which is different from that of the second face, opposite the first face, can be accepted.

Particularly advantageously, this is possible using a technique of stacking portions 51, 52 of the electric via 50, such as the one used in the present invention, only.

Upon completion of the step of aligning, a step of permanent bonding of the first portion 51 of the electric via 50 of the first substrate 100 with the second portion 52 of the electric via 50 of the second substrate 200 is executed.

In the field of interconnections, a wide range of technologies is available both for electrical contacts proper («solder balls», «copper pillars», copper-copper direct connections, etc.) adapted to the various types of electrical contacts (the «pitch», i.e. the size of the contacts and the spacing thereof, ranges from several hundreds of to a few microns), and for the redistribution so that they can be geometrically and mechanically compatible with all the subsequent operations such as stacking and assembling/bonding.

Various "bonding" technologies are provided so as to cover all the specifications required by the manufacturers.

However, a method of "direct bonding" enabling a direct bonding between the wafers or between the chips and requiring no bonding material, nor significant heating or high pressure will most preferably be used. Such technology is based on molecular adhesion between the atoms of two opposite surfaces. Direct bonding has never been used as a technology enabling to produce mechanically stable interposers compatible with the procurement lines.

Particularly advantageously, the first substrate 100 is bonded onto the second substrate 200 from the first portion 51 of the electric via 50 of the first substrate 100 and from the second portion 52 of the electric via 50 of the second substrate 200, by both mechanical and electrical bonding. The first portion 51 of the electric via 50 of the first substrate 100 and the second portion 52 of the electric via 50 of the second substrate 200 are so aligned that the alignment of the first substrate 100 and of the second substrate 200 creates at least one continuous electric via 50, while efficiently doubling the length of the electric via 50. An exemplary embodiment showed an alignment tolerance of less than one micron with contact pads having a surface of 5 $\mu m^2$ (which is significantly smaller than the 10 microns in diameter of the current electric vias of the TSV type). The contact resistance is negligible, when compared to the resistance of the through electric vias.

According to a preferred embodiment, the step of assembling comprises a direct bonding which is of the permanent bonding type. "Direct bonding" means the assembling of substrates 100, 200 executed so that the substrates 100, 200 are solid once in contact with one another, with said assembling advantageously requiring no intermediary means. "Permanent bonding" means a bonding providing a permanent adhesion of a substrate onto another substrate, for instance. A direct bonding of a first portion 51 of the electric via 50 of a first substrate 100 with a second portion 52 of the electric via 50 of a second substrate 200 from the electric vias 50, preferably made of copper, may be provided on said first substrate 100 and second substrate 200, by enabling both mechanical and electrical bonding between the first and second portions 51, 52 of the electric vias 50.

The bonding interfaces between the first portion 51 of the electric via 50 of the first substrate 100 and the second portion 52 of the electric via 50 of the second substrate 200 have surprisingly been measured as mechanically solid and reliable and having a low electric resistance. This concept may particularly advantageously be extended to other substrates 100, 200 or conductors.

Using all types of permanent bonding on any type of support is allowed in the method according to the invention. The bonding may be of the «silicon direct bonding» type. According to this exemplary embodiment, the assembling supports 100, 200 are of the Silicon/Silicon type. The surface of each support 100, 200 intended to be assembled preferably comprises silicon dioxide ($SiO_2$). According to other embodiments of the invention, which are not restrictive, the conducting materials may be glass/glass, metal/metal or metal oxide/metal oxide assemblies. The method of the invention thus comprises a step of bonding, i.e. direct bonding or molecular bonding. The techniques of substrates bonding belong to the manufacturing process of the microelectronic devices. However, the techniques of substrates bonding generally require to use an intermediary adhesive layer, such as resist, a polymer or a metallic layer, for instance inserted between the substrates.

Particularly advantageously, the present invention does not require to use an intermediary layer between the first substrate 100 and the second substrate 200.

The step of bonding is preferably followed by annealing. Annealing promotes the local melting of the material forming the electric via 50. The advantage of annealing lies in that it reinforces the bonding forces between the first substrate 100 and the second substrate 200. Particularly advantageously, this step of annealing aiming at reinforcing the sealing between a first substrate 100 and a second substrate 200 can be executed after each bond and/or forming of the stack with the various bonded substrates 100, 200. According to an advantageous embodiment, the present invention may be applied to an organic substrate 100, 200 having a small thickness. In this case, the organic material must resist the temperatures of annealing the copper forming the electric via 50 which are close to 400° C. Advantageously, the annealing temperature is selected so that the mechanical bonding and the electric contact at the interface between the portions of the electric via 50 are enhanced. Particularly advantageously, the presence of oxides on the metallic surface of the electric via 50, as negligible as it may be, makes it possible to enhance the electric contact, without requiring however to exceed a glass transition temperature. The ranges of temperatures used for annealing vary according to the presence of oxides on the metallic surfaces of the portions of the electric via 50 as well as the materials used for said portions of the electric via 50. Advantageously, the annealing temperature ranges from 0° C. to 1,000° C., and preferably from 100° C. to 800° C. According to a particular embodiment comprising copper, the optimal annealing temperature preferably ranges from 100° C. to 400° C. Particularly advantageously, the annealing temperature is selected so as to reinforce the direct bonding, on the one hand, and, to promote the sealing of the conducting materials of the vias, on the other hand.

Figure 4:
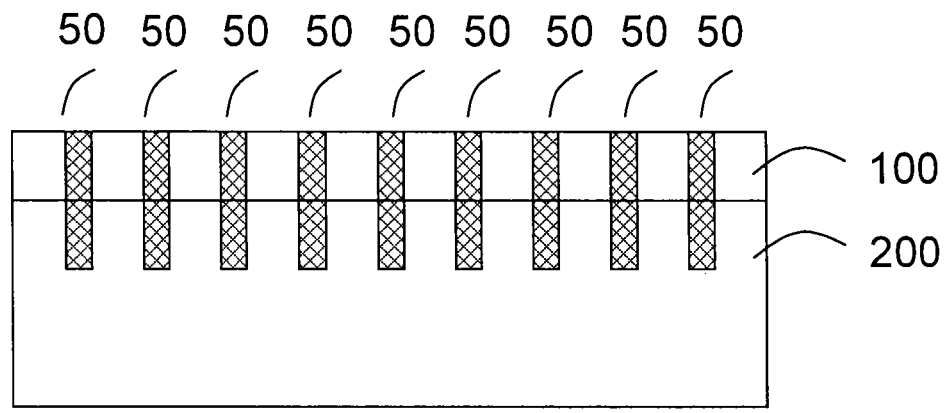
FIG. 4 illustrates the step of partially removing a part of the first substrate from the second face of the first substrate, opposite the first face of said first substrate, so as to reach the first portion of said electric via.

FIG. 4 illustrates a step of partially removing a part of the first substrate 100 from the second face of the first substrate 100, opposite the first face of said first substrate 100, so as to reach the first portion 51 of the electric via 50. Particularly advantageously, the step of partially removing a part of the first substrate 100 comprises polishing. The polishing of a part of the first substrate 100 is preferably a mechanical-chemical polishing (or planarization) (or CMP, the English acronym for «Chemical Mechanical Planarization» or «Chemical Mechanical Polishing». For example, this process levels the reliefs on the silicon oxide or polysilicon layers, as well as on the metallic layers. It is used for planarizing such layers in order to prepare same to the subsequent lithographic steps, thus avoiding the problems of adjustment resulting from the various depths upon lighting the photosensitive resist.

Such step of partially removing a part of the first substrate 100 is a planarization used for thinning said substrate 100. This step thus consists in thinning the first substrate 100 from the second face so as to reach the first portion 51 of the electric via 50. The step of partially removing a part of the first substrate 100 stops as soon as the first portion 51 of the electric via 50 is reached. According to a preferred embodiment, the step of partially removing a part of the first substrate 100 stops as soon as an increase in the resisting torque is detected. In this particular case, the mechanical action of the chemical mechanical planarization makes it possible to polish the protruding material of the first portion 51 of the electric via 50, since the opening rate is very low (less than 1%); with the opening rate corresponding to the protruding surface divided by the total surface of the wafer. When the protrusions are polished, the material forming the first portion 51 of the electric via 50 then represents nearly the whole of the surface of the wafer, and the polishing speed is then significantly reduced. The first portion 51 of the electric via 50 becomes a barrier layer for the step of chemical mechanical polishing. Besides, the gap between each electric via 50 provided on the first substrate 100 is so configured as to promote a better control of the stopping of the chemical mechanical polishing.

Advantageously, upon completion of this step of partially removing a part of the first substrate 100, the second face of the first substrate 100 is totally planarized, with portions 51 of the electric vias 50 being flush with the surface.

Particularly advantageously, the first substrate 100 and the second substrate 200 are stacked and form at least an electric via 50 having a form factor twice better than the original form factor since it comprises the first portion 51 of the first substrate 100 and the second portion 52 of the second substrate 200.

It has been noted that the contact resistance between the copper contacts is negligible when compared to the already acceptable resistance of the electric vias 50 of the TSV or TGV types. It has also been noted, after trials, that the reliability of the electromigration does not depend on the bonding interface. In other words, an electric performance similar to that of a copper wire approximately 10 microns in diameter, for instance, is obtained.

Upon completion of the step of partially removing a part of the first substrate 100, a mechanically autonomous microelectronic device is obtained which forms, for example, a capacity electrode from an electric via 50 having at least a double form factor, in a conventional case; this is obtained through the bond of a first portion of the first substrate 100 onto the second portion of the electric via of the second substrate 200. Providing capacities by stacking portions 51, 52 of the electric via 50 particularly advantageously enables to obtain capacities with great depth and thus to enhance the capacitance thereof. Thanks to the advantages involved in the direct bonding techniques, a passage with a low electric resistance may be provided through the electric via 50 formed by the first and the second portions 51, 52.

The method may preferably be repeated until the stack of the plurality of substrates 100, 200 has a sufficient thickness to reach mechanical stability. Stacking will then be executed from the second face of one of the substrates, with said face having been polished beforehand, preferably by chemical mechanical polishing in order to expose a portion 51, 52 of the electric via 50. Advantageously, the portions 51, 52 of the electric via 50 are flush with the surface, upon completion of the steps of chemical mechanical polishing. Such steps of polishing advantageously make it possible to planarize the surface and promote uniformity. The portions of the electric via 50 are flush with the surface. The assembling of the substrates 100, 200 by bonding is improved and promotes a better mechanical bonding between the substrates 100, 200 as well as a better electrical contact between the portions 51, 52 of the electric via 50 flush with the surface.

Figure 5:
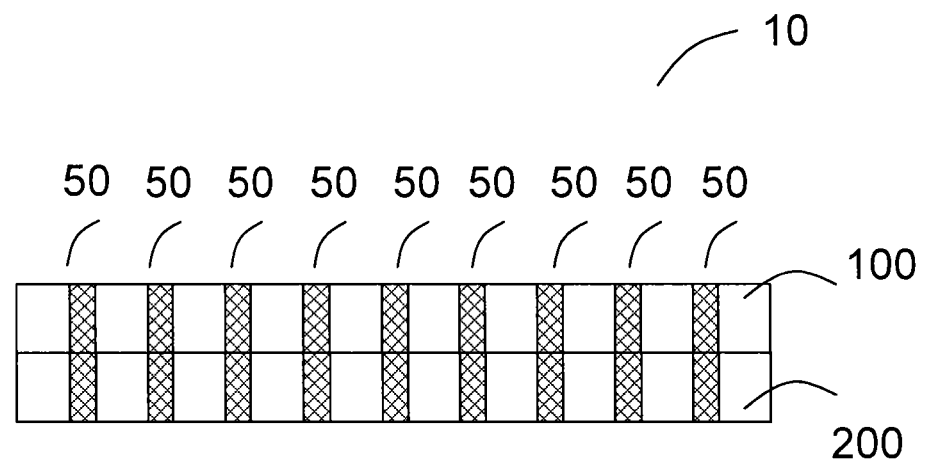
FIG. 5 illustrates a mechanically autonomous microelectronic device comprising at least one electric via and usable as an interposer.

FIG. 5 illustrates a mechanically autonomous microelectronic device comprising at least one electric via and usable as an interposer. Particularly advantageously, the mechanically autonomous microelectronic device 10 comprising at least one electric via enables an electric connection from at least a first face of the device. A first substrate 100 comprising a first portion 51 of the electric via 50 exposed to a first face of the first substrate 100 and a second substrate 200 comprising a second portion 52 of the electric via exposed to a first face of the second substrate 200 preferably cooperate from a bonding interface.

Particularly advantageously, the method according to the present invention makes it possible to efficiently at least double the form factor of the electric via 50. Such mechanically autonomous microelectronic device 10 thus has a structure which is mechanically more stable than the original version since it is thicker. If the device 10 is already thick enough, or mechanically stable enough, it may then be used as such for additional steps of standard processing.

According to a preferred embodiment, the stacking of the portions 51, 52 of the electric via 50 from a plurality of substrates 100, 200 goes on unchanged until a thickness specific to the mechanically autonomous microelectronic device 10, i.e. a defined length of the electric via 50, is reached.

According to one embodiment, two stacks of two additional substrates comprising at least one electric via 50 and a double form factor are assembled by bonding to form at least an electric via 50 having a quadruple form factor.

According to still another embodiment, a substrate comprising at least one electric via 50 is stacked on a stack of substrates comprising at least one electric via 50 so as to form 3×, 4×, 5×, ..., n× portions of the electric via 50, with a form factor of the electric via 50n times better than the one normally possible.

The thickness of the final mechanically autonomous microelectronic device can be controlled by determining the final form factor of the electric via 50, which in turn can be controlled by the number of stacked portions of the electric via 50.

In the case of a silicon substrate 300 millimeters in diameter, a mechanically autonomous microelectronic device with a thickness of approximately 400 microns seems satisfactory. With the currently used technology of electric vias of the TSV type, a stack of four substrates comprising at least one electric via 50 should then be used. In the case of a silicon substrate 200 millimeters in diameter, a mechanically autonomous microelectronic device could have a thickness of approximately 300 microns. With the currently used technology of electric vias, a stack of three substrates comprising at least one electric via 50 should then be used. However, considering the improvements in the form factors of the through electric vias of the TSV or TGV types, the number of substrates, in both cases, could be reduced.

Particularly advantageously, the stacking order may vary. According to a preferred embodiment, the stacking of portions 51, 52 of the electric via 50 is executed from the first face of the substrate provided with the portions 51, 52 of the electric via 50. According to another embodiment, the stacking of portions 51, 52 of the electric via 50 is executed from the second face of the substrate provided with the portions 51, 52 of the electric via 50.

Particularly advantageously, at least one substrate of the stack of portions 51, 52 of the electric via 50 comprises a semi-conducting, organic or glass material. According to another embodiment, the various substrates of the stack of portions 51, 52 of the electric via 50 are all made of a semi-conducting, organic or glass material.

According to one embodiment wherein more than two substrates are stacked, the principle of compensation of an alignment offset is also applicable.

Figure 6:
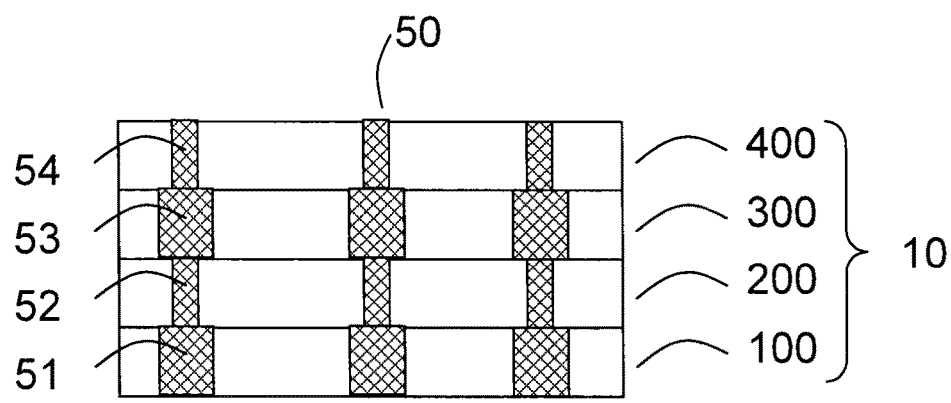
FIG. 6 illustrates a mechanically autonomous microelectronic device having a quadruple form factor and portions of the electric via with different diameters.

FIG. 6 illustrates a configuration wherein the mechanically autonomous microelectronic device 10 is formed by the stacking of four substrates 100, 200, 300, 400. The electric via 50 is advantageously formed by direct bonding of a first portion 51, a second portion 52, a third portion 53 and a fourth portion 54 of a via. According to an alternative solution, the first, second, third and fourth portions 51, 52, 53, 54 of the electric via 50 have the same longitudinal axis according to the thickness of the substrates 100, 200, 300, 400. The second portion 52 of the electric via 50 of the second substrate 200 has a greater diameter than that of the first portion 51 and of the third portion 53 of the electric via 50 of the first and third substrates 100, 300, respectively. According to another exemplary embodiment, the electric via 50 may be a stack of portions 51, 52, 53, 54 of the electric via 50, with the diameter of each portion 51, 52, 53, 54 gradually increasing or reducing from a first face of the electric via 50 up to a second face of the electric via 50.

Figure 7:
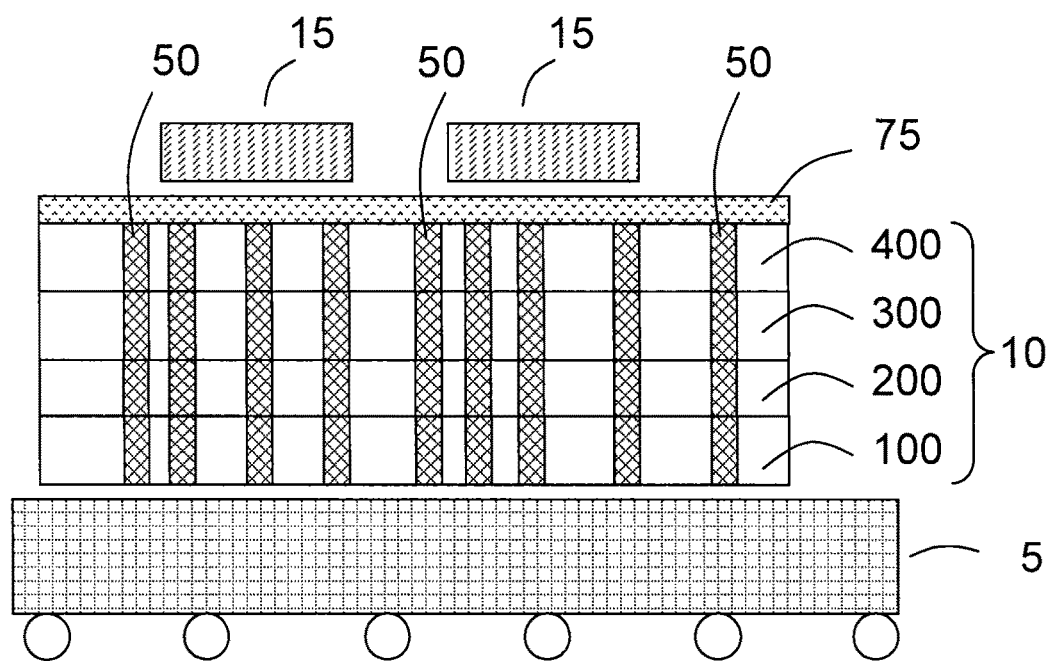
FIG. 7 illustrates a mechanically autonomous microelectronic device having a quadruple form factor and a redistribution layer on at least a first face.

FIG. 7 illustrates a mechanically autonomous microelectronic device 10 advantageously providing a quadruple form factor further to the stacking of four substrates 100, 200, 300, 400 provided with portions 51, 52, 53, 54 of electric vias 50. The mechanically autonomous microelectronic device 10 preferably has a redistribution layer 75, on at least a first face. The redistribution layer 75 generally comprises a stack of layers, with at least one of these being an electrically conductive and structured layer. Such redistribution layer may of course be used in FIG. 1B, although it is not shown. More generally, a redistribution layer 75 may be used on each one of the two faces of the mechanically autonomous microelectronic device 10. It may preferably be deposited onto the first face of the mechanically autonomous microelectronic device 10 whereon at least one electric via 50 is exposed, with the mechanically autonomous microelectronic device 10 being produced according to the method of the present invention. Particularly advantageously, the redistribution 75 may be deposited onto the first face and the second face, opposite the first face, of the mechanically autonomous microelectronic device 10, with at least one electric via 50 being exposed on these faces.

Whereas the main interest of interposers consists in providing a redistribution of cables between small width chip interconnections and a preferably organic, very wide, substrate 5, an additional advantage consists in that the presence of a redistribution layer 75 on the mechanically autonomous microelectronic device 10 also enables to stack chips 15 side by side. This enables shorter and closer direct vertical connections between the chips 15, enabling a better bandwidth and higher transmission speed, i.e. advantages expected from a conventional 3D integration. The present invention advantageously relates to all 3D integration methods.

According to one embodiment shown in FIG. 6, the gap between each electric via 50 on the same substrate 100, 200, 300, 400 varies. Particularly advantageously, the gap between each portion 51 of the electric via 50 of a first substrate 100 is so configured as to match the gap between each portion 52, 53, 54 of the electric via 50 of the other substrates 200, 300, 400 of the stack. Particularly advantageously, the gap between each electric via 50 provided on the same substrate 100, 200, 300, 400 is so configured as to preserve, on each one of the faces of the substrate 100, 200, 300, 400, a sufficient proportion of the material comprised in the substrate to secure the direct bonding with at least another substrate 100, 200, 300, 400.

Optionally, the method is so standardized as to produce the same substrates 100, 200, 300, 400 with portions 51, 52, 53, 54 of the electric via 50.

A large number of applications exist for the mechanically autonomous microelectronic devices 10. Any application requiring a conventional interposer can take advantage of a mechanically autonomous microelectronic device 10 like the one of the present invention.

A possible application for this mechanically autonomous microelectronic device 10 is for instance the "packaging" consisting in assembling chips 15, which may be optimized by a shorter (and thus more efficient and quicker) interconnection method and thus result in more compact systems. In this case, the interposer advantageously has three functions: re-routing of the chips 15 connexions to the connexion to the substrate 5, yield enhancement by reducing the surface of the chips 15 (for example, four chips 15 per package instead of one) and the heterogeneous integration i.e. stacking of various technologies in the same package of silicon.

The present invention enables to increase the form factor of the electric vias 50 through a permanent bonding, in general and more particularly through a direct bonding, which enables a utilization in the conventional 3D integration processes. The present invention enables to make a microelectronic device 10 comprising at least one electric via 50 mechanically stable and autonomous. This more particularly enables to reduce the brittleness, deformation and bending of the interposers.

The present invention makes it possible to avoid handling very thin materials. No very thin substrate is required in the method of production. The final mechanically autonomous microelectronic device 10 may be as thin (or thick) as required in order to totally eliminate the stress resulting from the bending or the deformation of said device.

The present invention is not limited to the above described embodiments but applies to any embodiment complying with its spirit. More particularly, the invention is not limited to interposers and applies to any type of mechanically autonomous microelectronic device.

The invention is not limited either to the production of electric vias used as electric connections only. As a matter of fact, the method may comprise the production of at least another electric via 50 simultaneously with said at least one electric via, with the vias comprising a material with thermal and electric properties so that said other electric via 50 forms a thermal via. The thermal via is advantageously able to conduct heat and cannot be used to form an electric connection. The thermal vias and the electric vias are identical as regards their structures, but not their functions.

The invention claimed is:

1. A method for producing a mechanically autonomous microelectronic device comprising at least one electric via enabling an electric connection from at least one first face of the device, the method comprising the following sequence of operations:
   from a first substrate comprising a first portion of the at least one electric via exposed to a first face of the first substrate, and from a second substrate comprising a second portion of the at least one electric via exposed to a first face of the second substrate, bonding the first substrate to the second substrate, by direct bonding of the first faces thereof so that the first portion and the second portion of the at least one electric via are in electrical continuity; and
   partially removing a part of the first substrate from a second face of the first substrate, opposite the first face of the first substrate, so as to reach the first portion of the at least one electric via,
   wherein said direct bonding is from one or more of the first substrate comprising the first portion of the at least one electric via unexposed from the second face of the first substrate, and the second substrate comprising the second portion of the at least one electric via unexposed from the second face of the second substrate.

2. A method according to claim 1, further comprising partially removing a part of the second substrate from a second face of the second substrate, opposite the first face of the second substrate, so as to reach the second portion of the electric via.

3. A method according to claim 1, further comprising producing at least one other electric via simultaneously with said at least one electric via, with the vias being comprised of a material with thermal and electrical properties so that said other electric via forms a thermal via.

4. A method according to claim 1, further comprising bonding at least one other substrate to the first substrate and/or the second substrate.

5. A method according to claim 1, wherein said bonding the first substrate to the second substrate includes aligning the first portion of the at least one electric via of the first substrate with the second portion of the at least one electric via of the second substrate.

6. A method according to claim 1, further comprising annealing the first and second substrates after said bonding the first substrate to the second substrate.

7. A method according to claim 1, wherein said partially removing the part of the first substrate includes polishing the second face of the first substrate.

8. A method according to claim 1, wherein said direct bonding includes bonding only surfaces of the first faces.

9. A method according to claim 1, wherein said partially removing the part of the first substrate from the second face of the first substrate exposes the first portion of the at least one electric via.

10. A method according to claim 2, wherein said partially removing the part of the second substrate includes polishing the second face of the second substrate.

11. A method according to claim 2, wherein said partially removing the part of the second substrate from the second face of the second substrate exposes the second portion of the at least one electric via.

12. A method according to claim 2, wherein said direct bonding is from one or more of the first substrate comprising the first portion of the at least one electric via unexposed from the second face of the first substrate, and the second substrate comprising the second portion of the at least one electric via unexposed from the second face of the second substrate.

13. A method according to claim 1, wherein the first portion of the at least one electric via has a first geometry, and the second portion of the at least one electric via has a second geometry different from the first geometry.

14. A method according to claim 1, wherein the mechanically autonomous microelectronic device has the first substrate with the first portion of the at least one electric via exposed from the second face of the first substrate, direct bonded to the second substrate with the second portion of the at least one electric via unexposed from the first and second faces of the second substrate.

15. A method according to claim 1, further comprising, before said bonding the first substrate to the second substrate, forming the first portion and the second portion of the at least one electric via, said forming including filling a first portion cavity and a second portion cavity with a solid filler.

16. A method according to claim 1, further comprising, before said bonding the first substrate to the second substrate, forming the first portion and the second portion of the at least one electric via, said forming including filing a first portion cavity and a second portion cavity by electrolysis.

* * * * *